US006303973B1

(12) United States Patent
Nakagawa et al.

(10) Patent No.: US 6,303,973 B1
(45) Date of Patent: Oct. 16, 2001

(54) POWER TRANSISTOR HAVING LARGE ELECTRIC CURRENT CAPACITY AND SEMICONDUCTOR INTEGRATED CIRCUIT DEVICE USING THE SAME

(75) Inventors: Eiji Nakagawa; Seiichi Yamamoto, both of Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/404,002

(22) Filed: Sep. 23, 1999

(30) Foreign Application Priority Data

Sep. 28, 1998 (JP) ................................................. 10-272818

(51) Int. Cl.[7] .................................................. H01L 27/082
(52) U.S. Cl. ......................... 257/565; 257/163; 257/164; 257/560; 257/561; 257/562; 257/563; 257/564; 257/573; 257/578; 257/579; 257/580; 257/582
(58) Field of Search ..................................... 257/565, 163, 257/164, 560–564, 573, 578, 579, 580, 582

(56) References Cited

U.S. PATENT DOCUMENTS

| | | | |
|---|---|---|---|
| 4,054,898 | * | 10/1977 | Streit et al. ............................ 357/36 |
| 4,151,542 | * | 4/1979 | Yajima et al. .......................... 357/36 |
| 4,157,561 | * | 6/1979 | Nawata et al. ......................... 357/36 |
| 4,291,319 | * | 9/1981 | Carinalli ................................ 357/13 |
| 5,089,873 | * | 2/1992 | Leduc .................................... 357/35 |
| 5,723,897 | * | 3/1998 | Leighton et al. ..................... 257/563 |

* cited by examiner

*Primary Examiner*—Eddie Lee
*Assistant Examiner*—Matthew E. Warren
(74) *Attorney, Agent, or Firm*—Hogan & Hartson, L.L.P.

(57) ABSTRACT

A power transistor comprising a collector region formed in a semiconductor substrate, a base region formed within the collector region, and a hoop-shaped emitter region formed within the base region. The hoop-shaped emitter region divides the base region into an external section and at least one internal section surrounded by the emitter region on the substrate surface, the external and internal base sections being connected within the substrate. A base contact is formed on the surface of each internal base section surrounded by the emitter region. By this design, the electric current is more uniform within the emitter region, and safe operating area (SOA) destruction can be prevented. The invention is also directed to semiconductor integrated circuit devices using the above power transistor, and a method of forming the same.

9 Claims, 5 Drawing Sheets

POWER TRANSISTOR HAVING LARGE ELECTRIC CURRENT CAPACITY AND SEMICONDUCTOR INTEGRATED CIRCUIT DEVICE USING THE SAME

BACKGROUND OF THE INVENTION

1. Field of the Invention

This invention relates to a power transistor and a semiconductor integrated circuit device using the same, and in particular, to such a transistor for use in the drivers of motors and actuators or in speaker drivers for audio systems that require electric current capacity.

2. Description of the Related Art

The structure of conventional power transistors is explained with references to FIGS. 7 and 8. The power transistor shown in FIGS. 7 and 8 is a vertically structured NPN-type power transistor formed within an epitaxial layer 72 of a P-type silicon semiconductor substrate. Vertical-type power transistors are the type in which the carriers that pass through the PN junction mainly diffuse in the vertical direction (the direction of the depth) of the transistor. FIG. 7 is a plan view showing the surface layout of a power transistor with one emitter region when viewed from above. FIG. 8 is a plan view showing the surface layout of a power transistor whose emitter region is divided into two by the base region when viewed from above. a low N-type impurity concentration. A base region 75 having P-type impurities is surrounded by the $N^-$-type collector region 72a, and an emitter region 76 having N-type impurities is formed inside the base region 75. A base contact 74 is formed on the surface of the base region 75. The structure of the base contact is shown in FIG. 9, where the base contact 91 connects the metal wiring (not shown) with the base region 93 by forming a hole on an insulating layer 92 that covers the surface of the base region, allowing wiring material, such as aluminum, to flow into the hole.

In FIG. 8, the power transistor has an $N^+$-type collector region 83 having a high N-type impurity concentration arranged in a ring form surrounding an $N^+$-type collector region 82a with a low N-type impurity concentration. A base region 85 having P-type impurities is surrounded by the $N^+$-type collector region 82a. Emitter regions 86a and 86b with N-type impurities are formed inside the base region 85. A base contact 84 is formed on the surface of the base region located between the emitter regions 86a and 86b.

However, when a power transistor such as the one shown in FIG. 7 is used, a large current flows in the portion of the base region 75 near where the base contact 74 is formed, because the base contact 74 is in contact with the metal wiring layer. This is because the carriers in the circumference portion of the emitter region 76 near the base contact 74 are in an easy flow state ("easily activated state") compared with carriers in the center portion of the emitter region 76 far from the base contact 74. Also, when considering the flow of carriers in the vertical and lateral directions (the horizontal direction along the surface), the circumference portion of the emitter region 76 is closer to the $N^+$-type collector region 73 compared with the center portion of the emitter region 76. Because of this, the carriers in the circumference portion is more easily dissipated to the collector region 73 than the carriers in the center portion.

Therefore, the current density that flows from the emitter region 76 is non-uniform in some of the regions, causing heat to accumulate due to concentration of current, possibly causing safe operating area (SOA) destruction. In order to reduce current concentration in the emitter region 76 to prevent SOA destruction, the width b of the emitter region 76 is narrowed in some devices. But this will reduce the area of the emitter region 76 and result in a decrease in overall current capacity.

When a power transistor as shown in FIG. 8 is used, in which the overall emitter region area is enlarged by dividing the emitter region into two sections 86a and 86b, two regions A and B within the emitter region 86a and 86b (encircled by the broken lines in FIG. 8) are created, which areas are closest to both the base contact 84 and the collector region 83. As current flows from the metal wiring layer to the base region 85 via the base contact 84, carriers in the regions within the emitter regions 86a and 86b that are close to the base contact 84 are most easily activated. Because of this, large carrier flow will occur in the portions of the emitter regions close to this type of base contact.

In the aforementioned emitter regions A and B, these regions are in a state where the regions are activated to cause large carrier flow. When the emitter regions of the regions A and B are in such a state, the carrier flow is facilitated because the collector region is also in its proximity. Because of this, the current becomes concentrated in the emitter region in the A and B areas, making the area vulnerable to SOA destruction due to heat caused by the concentration of currents.

SUMMARY OF THE INVENTION

Accordingly, the present invention is directed to a power transistor that substantially obviates one or more of the problems due to limitations and disadvantages of the related art.

An object of the present invention is to provide a power transistor and semiconductor integrated circuit devices using the same with improved endurance properties against SOA destruction, by restraining the concentration of currents in the emitter region.

Another objective of the present invention is to obtain improved current capacity for a power transistor and semiconductor IC devices using the same by expanding the area of the emitter region as well as leveling the degree of activation of the carriers in the emitter region which depends on the distance from the base contact and the collector region.

To achieve these and other advantages and in accordance with the purpose of the present invention, as embodied and broadly described, the present invention provides a power transistor comprising in its vertical structure a collector region formed in a semiconductor substrate, a base region formed within the collector region, an emitter region formed within the base region, the emitter region dividing the base region into a first base section and at least one second base section surrounded by the emitter region on the substrate surface, the first and second base sections being connected within the substrate, and a base contact formed on the surface of each second base section. In such a power transistor, localized concentration of current is prevented by forming the base contact away from the collector region and within the section of the base region surrounded by the hoop-shaped emitter region.

According to another embodiment of the present invention, a plurality of base-emitter sections, each formed by a base region divided into two sections on the substrate surface by a hoop-shaped emitter region as described above, are formed within the collector region. By creating a plurality of such base-emitter sections in the power transistor, current concentration is further prevented.

According to yet another embodiment of the present invention, a contiguous emitter region is shaped to divide the base region into a plurality of sections each surrounded by the emitter region on the substrate surface, each surrounded section of the base region having a base contact formed there on. In such a power transistor, the current flow to the base region is stabilized by creating more than one contiguous hoop-shaped emitter region, and by forming a ballasting resistor on the surface of each section of the base region surrounded by the emitter region. The plurality of surrounded base sections may be arranged in a row, or in other geometrical shapes, such as five surrounded sections occupying the four corners and the center of a square. The latter arrangement further reduces current concentration because the surrounded base sections are arranged symmetrically.

In another aspect, the present invention provides a semiconductor integrated circuit device, such as an LSI, comprising a plurality of power transistors with improved endurance properties against SOA destruction.

In yet another aspect, the present invention provides a method of fabricating a power transistor, comprising forming a collector region in a semiconductor substrate, forming at least one base region within the collector region, forming an emitter region within each base region, the emitter region dividing the corresponding base region into a first base section and at least one second base section surrounded by the emitter region on the substrate surface, the first and second base sections being connected within the substrate, and forming a base contact on the surface of each second base section.

It is to be understood that both the foregoing general description and the following detailed description are exemplary and explanatory and are intended to provide further explanation of the invention as claimed.

DETAILED DESCRIPTION OF THE PREFERRED EMBODIMENTS

Figure 1A:
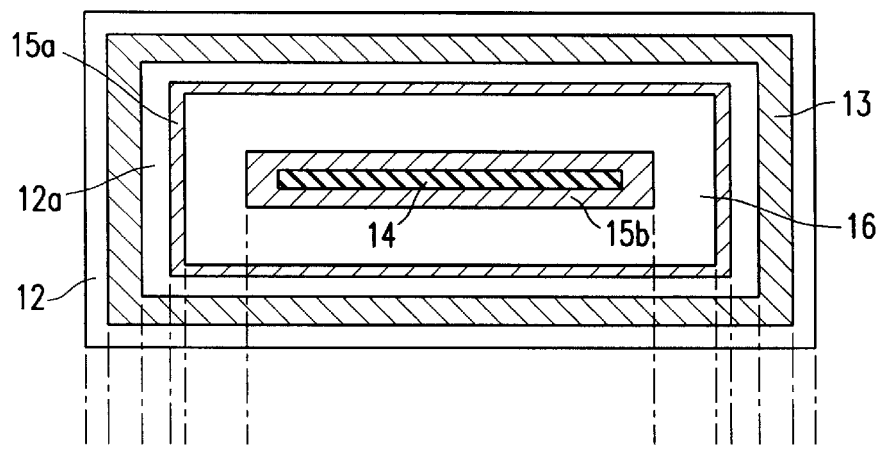
FIG. 1(A) is a plan view showing the surface layout.

The embodiments of the present invention are described in detail with reference to the figures. In FIGS. 1, 3, 4 and 6, similar reference numerals designate similar structures. For example, reference numerals 13, 33, 43 and 63 designate collector regions of the transistors in the respective figures. A vertically-structured NPN-type power transistor formed on a P-type silicon semiconductor substrate is used as an example in the descriptions, but other forms of transistors can also be used.

Figure 1B:
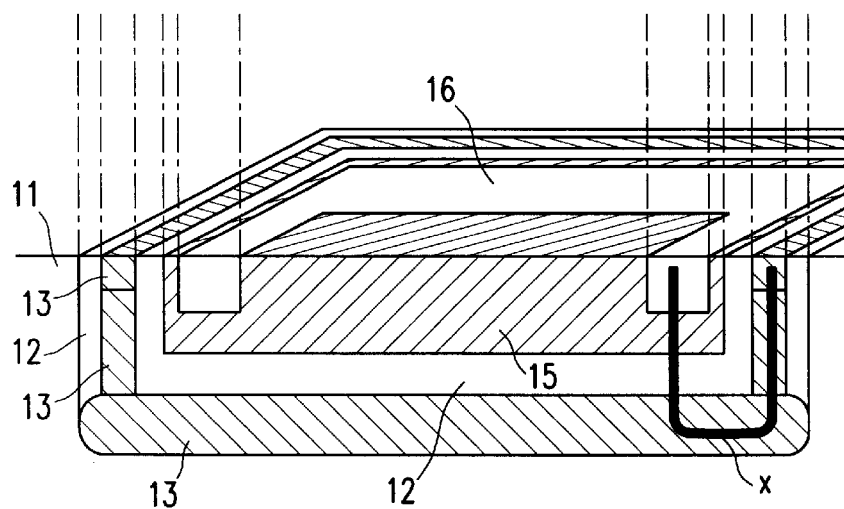
FIG. 1(B) is a perspective sectional view, of a power transistor according to a first embodiment of the present invention.

FIGS. 1(A) is a plan views showing the surface layout of a power transistor according to the first embodiment, and FIG. 1(B) is perspective cross-sectional view of the same. The power transistor is formed within an N-type epitaxial silicon layer 12 formed on a P-type silicon substrate 11. An $N^+$-type collector region 13 with a high N-type impurity concentration is formed in the N-type epitaxial layer 12, and an $N^-$-type collector region 12a with a low N-type impurity concentration is formed within and surrounded by the collector region 13. A base region 15 having P-type impurities is formed within the collection region 12a. Within the base region 15, a hoop-shaped emitter region 16 with diffused N-type impurities is formed, dividing the base region 15 into two sections at the substrate surface, an external base region 15a and an internal base region 15b. The external base region 15a and the internal base region 15b are connected within the substrate. A base contact 14 is formed on the surface of the internal base region 15b. The area comprising the base region 15a, the emitter region 16 surrounded by the base region 15a, and the base region 15b surrounded by the emitter region 16 forms a base-emitter region.

Figure 2:
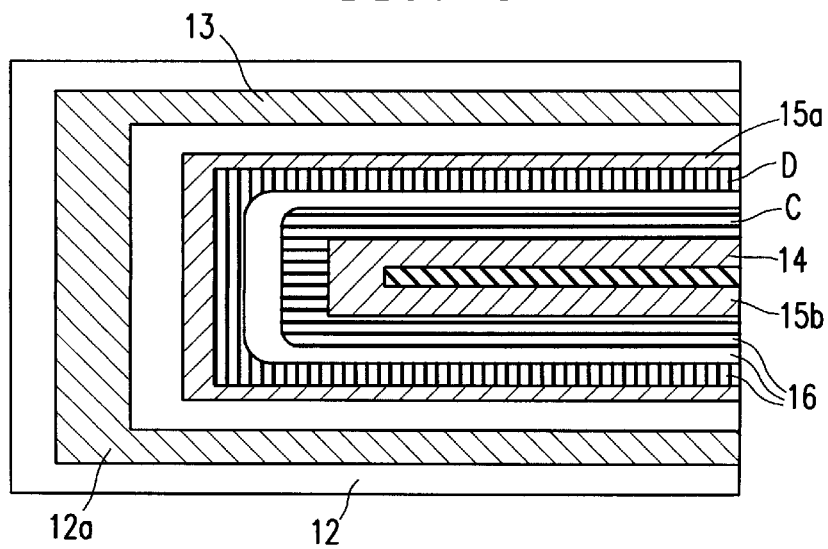
FIG. 2 is another plan view showing the surface layout of the power transistor of FIGS. 1(A) and 1(B).

In operation, the activated carriers dissipate from the emitter region 16 through the base region 15 to the collector region 13, through a route as indicated by the curve X with arrows in FIG. 1(B). When the current of the dissipated carriers flows through this route, the carriers in a region of the emitter region 16 that is closer to the base contact 14 (the region C in FIG. 2), is more easily activated than the carriers in other regions, but the length of the route is longer for the carriers in region C because it is located farther away from the $N^+$-type collector region 13. On the other hand, the carriers in a region of the emitter region 16 closer to the collector region 13 on the substrate surface (the region D in FIG. 2) have a shorter route to travel compared with carriers in other regions, but are more difficult to activate because the region D is located farther away from the base contact 14. Because of this, unlike in the conventional power transistors, the carrier current no longer concentrates in the area closer to the base contact 14, and substantially uniform current density is obtained in the entire area of the emitter region 16.

Figure 3:
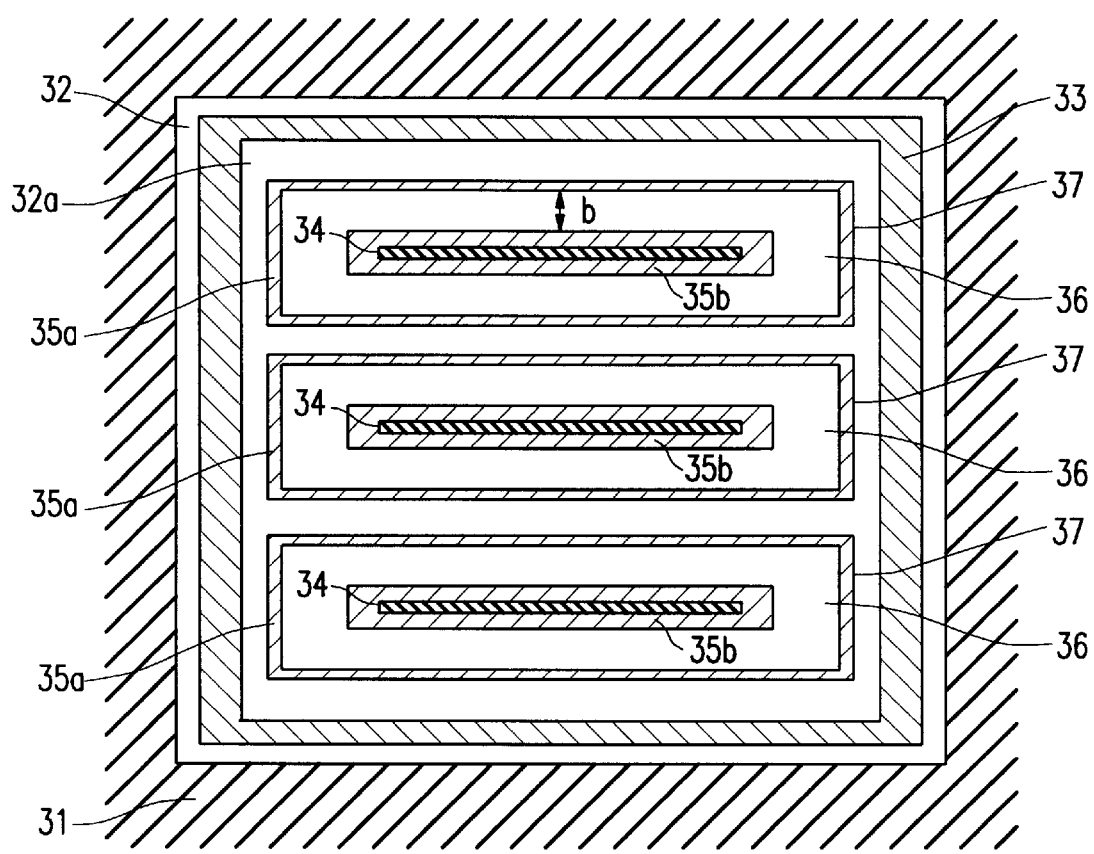
FIG. 3 is a plan view showing the surface layout of a power transistor according to a second embodiment of the present invention.

Referring to FIG. 3, a power transistor according to a second embodiment of the present invention is formed in an N-type epitaxial silicon layer 32 formed on a P-type silicon substrate 31. An $N^+$-type collector region 33 with a high N-type impurity concentration is formed within the N-type epitaxial layer 32, and an $N^-$-type collector region 32a with a low N-type impurity concentration is formed within and surrounded by the collector region 33. Three base regions 35 having P-type impurities are formed within the collection region 32a, and an emitter region 36 having N-type impurities is formed within each base region 35. Each emitter region 36 is formed in a hoop shape, dividing the respective base region into two sections at the substrate surface, an external base region 35a and an internal base region 35b surrounded by the respective emitter region 36. The respective external base region 35a and internal base region 35b are connected within the substrate. A base contacts 34 is formed on the surface of each internal base region 35b.

Each area comprising a base region 35a, the emitter region 36 surrounded by the base region 35a, and the base region 35b surrounded by the emitter region 36 forms a base-emitter region 37. In FIG. 3, three such base-emitter regions 37 are formed within the internal surface of the $N^+$-type collector region 32a, preferably at equal distances from each other. Each base-emitter region 37 shown in FIG. 3 has a region width narrower than that of the base-emitter region in the embodiment of FIG. 1. Because of this, the regions C and D (FIG. 2) within the emitter region 36 shown in FIG. 3 are located closer to each other than the corresponding regions C and D in the embodiment of FIGS. 1 and 2, and the state of activation is also closer in the embodiment of FIG. 3. Therefore, the current density as a whole is more even than in the embodiment of FIG. 1. Moreover, as the area of the external and internal circumference of the emitter region occupies a large part of the entire emitter region, concentrated current flowing to parts of the external and internal circumference is further limited.

Figure 4A:
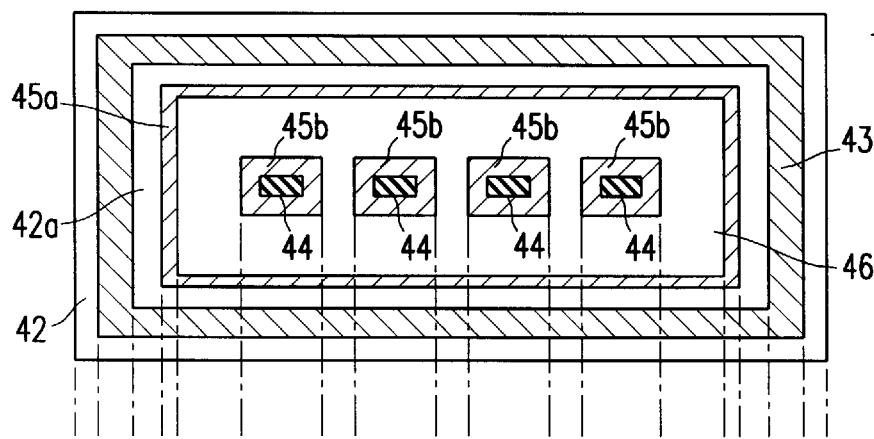
FIG. 4(A) is a plan view showing the surface layout.
Figure 4B:
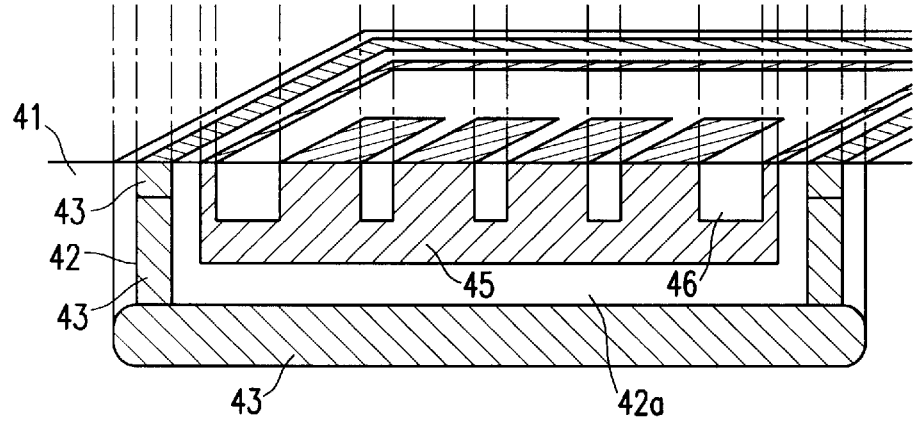
FIG. 4(B) is a perspective sectional view, of a power transistor according to a third embodiment of the present invention.

Referring to FIG. 4, a power transistor according to a third embodiment of the present invention is formed in an N-type epitaxial silicon layer 42 formed on a P-type silicon substrate 41. An $N^+$-type collector region 43 with a high N-type impurity concentration is formed within the N-type epitaxial layer 42, and an $N^-$-type collector region 42a with a low N-type impurity concentration is formed within and surrounded by the collector region 43. A base regions 45 having P-type impurities are formed within the collection region 42a, and an emitter region 46 having N-type impurities is formed within the base region 45. The emitter region 36 is formed in the shape of a contiguous hoop, dividing the base region into two sections at the substrate surface, an external base region 45a and a plurality of internal base regions 45b surrounded by the emitter region 46. The internal base regions 45b are arranged in a row, preferably at equal distance from each other. The external base region 45a and the plurality of internal base regions 45b are connected within the substrate. A base contacts 44 is formed on the surface of each internal base region 45b.

Figure 5:
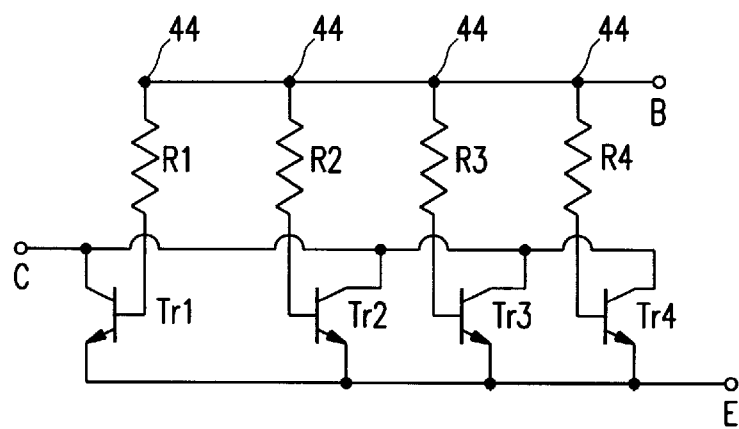
FIG. 5 shows a simplified equivalence circuit of the power transistor according to the third embodiment.

FIG. 5 is a simplified equivalence circuit diagram for the power transistor of FIG. 4, where transistors Tr1 to Tr4 have a common collector C and emitter E. The bases of the transistors Tr1 to Tr4 are connected through respective ballasting resistors R1 to R4 ("base ballasting resistors") to a common point B. When the transistors are in operation, the base ballasting resistors R1 to R4 apply a negative feedback on the base current flowing to the respective transistors Tr1 to Tr4, thus tending to minimize the differences between base currents in the base regions 45 of the four transistors. For example, if a large current flows through the base ballasting resistors R1 to the base of the transistor Tr1, the voltage drop across R1 will be large. Since the base ballasting resistors R1 to R4 are connected to a common voltage at point B and the emitters of the transistors Tr1 to Tr4 are also connected to a common emitter voltage E, the base to emitter voltage of transistor Tr1 becomes small, and the emitter current of transistor Tr1 drops accordingly. In this manner, the base ballasting resistors R1 to R4 adjust the base current as well as the emitter current or transistors Tr1 to Tr4. As a result, concentration of current to specific areas in the emitter region 46 is prevented.

Further, as in the embodiment of FIG. 3, it is possible to make the current density more uniform in the embodiment of FIG. 4 by forming more than one base-emitter regions within the $N^-$-type collector region 42a, where each base-emitter region comprises a plurality of internal base regions 45a, an emitter region 46 surrounding the internal base regions, and an external base region 45b surrounding the emitter region. The base-emitter regions are preferably arranged at equal distance from each other.

Figure 6:
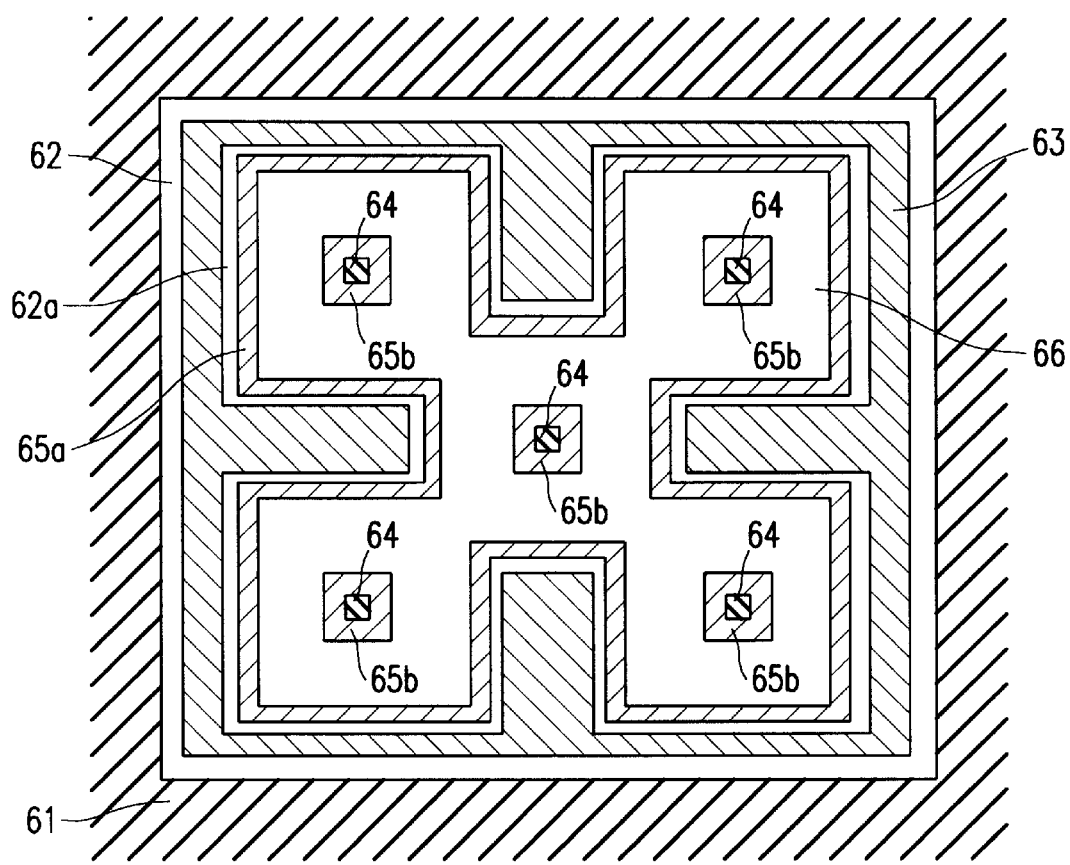
FIG. 6 is a plan view showing the surface layout of a power transistor according to a fourth embodiment of the present invention.
Figure 7:
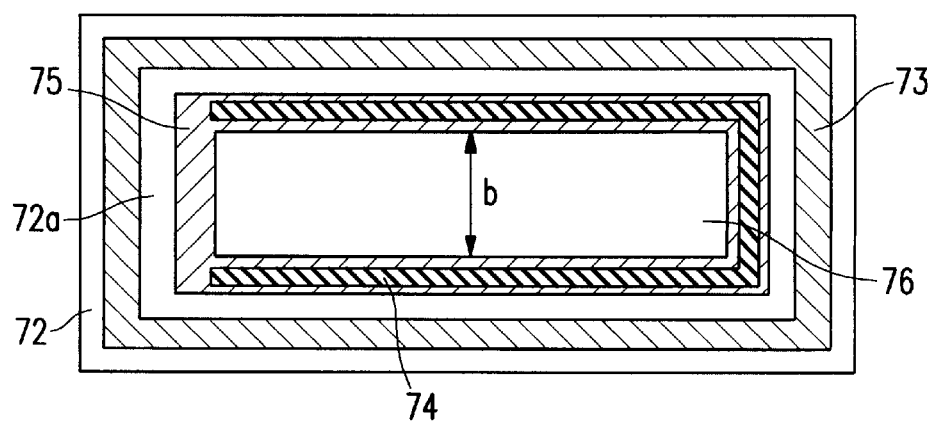
FIG. 7 is a plan view showing the surface layout of a conventional power transistor.
Figure 8:
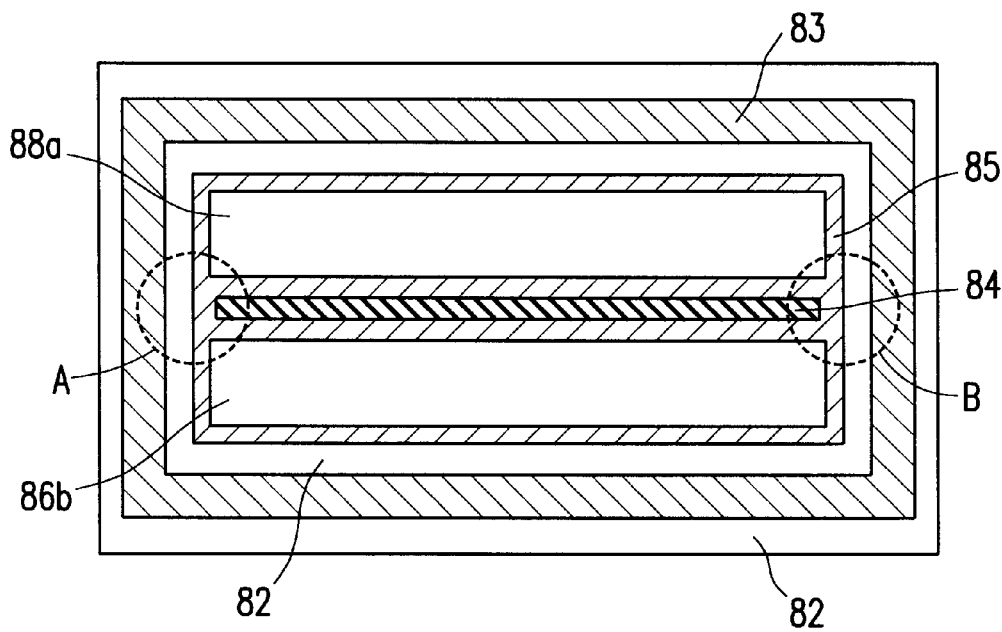
FIG. 8 is a plan view showing the surface layout of another conventional power transistor.
Figure 9:
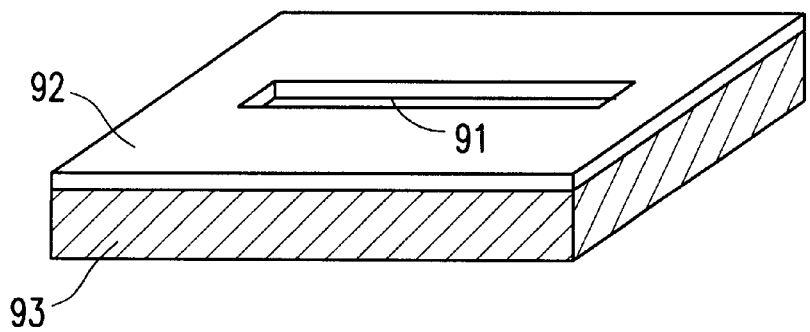
FIG. 9 is a perspective view of the base contact on the surface of the base region of the conventional power transistor of FIG. 7.

Referring to FIG. 6, a power transistor according to a third embodiment of the present invention is formed in an N-type epitaxial silicon layer 62 formed on a P-type silicon substrate 61. An $N^+$-type collector region 63 with a high N-type impurity concentration is formed within the N-type epitaxial layer 62, and an $N^-$-type collector region 62a with a low N-type impurity concentration is formed within and surrounded by the collector region 63. A base regions 65 having P-type impurities are formed within the collection region 62a, and an emitter region 66 having N-type impurities is formed within the base region 65. The base region 65 and the emitter region 66 are shaped so that the base region is divided on the substrate surface by the emitter region into two sections on the substrate surface, an external base region 65a and five internal base regions 65b which are connected within the substrate. The five internal base regions are located to occupy the four corners and the center of a rectangle (preferably a square), and each internal base region 65b is surrounded by a rectangle-shaped (preferably square-shaped) portion of the emitter region 66. In addition, the $N^+$-type collector region 63, the $N^-$-type collector region 62a and the external base region 65a are shaped so that each portion of the emitter region 66 surrounding an internal base region 65b is in turn substantially surrounded by a portion of the external base region 65a, a portion of the $N^-$-type collector region 62a and a portion of the $N^+$-type collector region 63, as shown in FIG. 6. A base contact 64 is formed on the surface of each internal base region 65b.

The embodiment of FIG. 6 is similar to the embodiment of FIG. 4 in that its equivalent circuit (not shown) has a plurality of transistors having a common emitter voltage and common collector voltage, where the bases of transistors are connected to a common voltage through respective serial-connected base ballasting resistors. Thus, similar to the embodiment of FIG. 4, the emitter currents of the transistors are adjusted by the base ballasting resistors, preventing a concentration of current in any small area within the emitter region 66. In addition, each internal base region 65b and the corresponding emitter region 66, external base region 65a, and $N^-$-type collector region 62a are arranged symmetrically in four directions around the corresponding base contact 64. This restrains current from concentrating in any specific section.

Moreover, while the shape of the base and emitter regions shown in FIG. 6 is rectangular or square, similar advantages can be obtain by using other shapes. In addition, other geometric configurations of the internal base regions 65b can be used.

While the above embodiments are directed to single power transistors, more than one power transistor can be formed in a single semiconductor substrate in a semiconductor integrated circuit device, such as an LSI device.

It will be apparent to those skilled in the art that various modifications and variations can be made in a method of fabricating a thin film transistor of the present invention without departing from the spirit or scope of the inventions. Thus, it is intended that the present invention covers the modifications and variations of this invention provided they come within the scope of the appended claims and equivalents.

What is claimed is:

1. A vertical-structured power transistor comprising:
   a semiconductor substrate;
   a collector region formed in the substrate;
   a base region formed within the collector region;
   an emitter region formed within the base region, the emitter region dividing the base region into a first base section and at least one second base section surrounded by the emitter region on the substrate surface, the first and second base sections being connected within the substrate; and a base contact formed on the surface of each second base section.

2. The power transistor of claim 1, wherein the emitter region divides the base region into at least two second base sections arranged in a row.

3. The power transistor of claim 1, wherein the emitter region divides the base region into five second base sections arranged to occupy the four corners and the center of a rectangle.

4. The power transistor of claim 3, wherein the rectangle is a square, wherein each second base section is square shaped, and wherein the emitter region, the first base section and the collector region substantially surround each second base section from four sides.

5. A semiconductor integrated circuit device comprising at least one power transistor of claim 1.

6. A vertical-structured power transistor comprising:

a semiconductor substrate;

a collector region formed in the substrate;

a plurality of base regions formed within the collector region;

a plurality of emitter regions each formed within a base region, the emitter regions dividing the corresponding base region into a first base section and at least one second base section surrounded by the emitter region on the substrate surface; and a base contact formed on the surface of each second base section.

7. The power transistor of claim 6, wherein the plurality of base regions are arranged in a row.

8. A semiconductor integrated circuit device comprising at least one power transistor of claim 6.

9. A method of fabricating a power transistor comprising:

forming a collector region in a semiconductor substrate;

forming at least one base region within the collector region;

forming an emitter region within each base region, the emitter region dividing the corresponding base region into a first base section and at least one second base section surrounded by the emitter region on the substrate surface, the first and second base sections being connected within the substrate; and forming a base contact on the surface of each second base section.

* * * * *